(12) United States Patent
Kamm et al.

(10) Patent No.: US 8,353,210 B2
(45) Date of Patent: Jan. 15, 2013

(54) SYSTEM FOR MEASURING A PHYSICAL VARIABLE

(75) Inventors: Lars Kamm, Mühlehorn (CH); Werner Hinn, Stäfa (CH); Roman Baumann, Bänk (CH)

(73) Assignee: Tecan Trading AG, Mannedorf (CH)

( * ) Notice: Subject to any disclaimer, the term of this patent is extended or adjusted under 35 U.S.C. 154(b) by 729 days.

(21) Appl. No.: 12/516,491

(22) PCT Filed: Oct. 30, 2007

(86) PCT No.: PCT/CH2007/000536
§ 371 (c)(1),
(2), (4) Date: May 27, 2009

(87) PCT Pub. No.: WO2008/064500
PCT Pub. Date: Jun. 5, 2008

(65) Prior Publication Data
US 2010/0071459 A1    Mar. 25, 2010

(30) Foreign Application Priority Data
Dec. 1, 2006  (CH) .................................. 1957/06

(51) Int. Cl.
*G01F 23/26*    (2006.01)

(52) U.S. Cl. ........ 73/304 C; 324/658; 324/687; 324/716
(58) Field of Classification Search ................ 73/304 R, 73/304 C; 324/649–724
See application file for complete search history.

(56) References Cited

U.S. PATENT DOCUMENTS

| | | | | |
|---|---|---|---|---|
| 5,844,415 A * | 12/1998 | Gershenfeld et al. | ......... | 324/663 |
| 5,936,412 A | 8/1999 | Gershenfeld et al. | | |
| 6,437,583 B1 * | 8/2002 | Tartagni et al. | ............... | 324/687 |
| 6,828,802 B2 * | 12/2004 | Schulte | ......................... | 324/658 |
| 7,378,856 B2 * | 5/2008 | Peine et al. | .................... | 324/662 |

FOREIGN PATENT DOCUMENTS
GB    2 286 247    8/1995

* cited by examiner

*Primary Examiner* — Hezron E Williams
*Assistant Examiner* — Hoang Nguyen
(74) *Attorney, Agent, or Firm* — Notaro, Michalos & Zaccaria P.C.

(57) ABSTRACT

The invention relates to a system for measuring a physical variable using a plurality of measuring sensors (20). Said system is characterized in that an inverting measuring signal amplifier (17; 17.1, 17.2) is connected downstream of every measuring sensor (20), one output of a sensor (20) each being connected to an inverting input of the measuring signal amplifier (17; 17.1, 17.2) connected downstream of the measuring sensor (20).

7 Claims, 15 Drawing Sheets

Prior art

Prior art

SYSTEM FOR MEASURING A PHYSICAL VARIABLE

NOTICE OF RELATED APPLICATIONS

This application claims the priority of Swiss Patent Application 1957/06, which was filed on 1 Dec. 2006 and the content of whose disclosure is hereby incorporated by reference in its entirety.

TECHNICAL AREA

The invention relates to a system for measuring a physical value according to the preamble of claim 1.

PRIOR ART

Capacitive sensors are frequently used for measuring physical values, such as pressure, fill level, volume, or the relative dielectric index, which operate on the basis of the change of the capacitance of a single capacitor or an entire capacitor system through the physical value to be measured. The physical value to be measured is concluded by measuring the capacitance of the sensor. Capacitive sensors are used either individually or in systems of multiple spatially closely adjacent sensors. Capacitive individual sensors are used, for example, for pressure, acceleration, and position measurements. Capacitive systems and/or multiple sensor systems are used, for example, in the capacitive touchpad or in capacitive fingerprint sensors. FIG. 1 shows an example of a schematic illustration of a capacitive sensor system 1 having multiple capacitive (measuring) sensors, which are formed by a transmitter electrode S and receiver electrodes $E_1, E_2, \ldots$, the one transmitter electrode S being shared by all sensors. The receiver electrodes $E_1, E_2, \ldots$ are situated spaced apart from the transmitter electrode S. A signal source 2 is provided for activating (and/or operating) the sensor system 1.

Using a sensor system having multiple capacitive sensors, three-dimensional dielectric or conductive structures may be detected and scanned, such as the embossed image of a coin (example of a conductive structure) or the fill level of a micro-titration plate, as is used, for example, in pipetting automats (example of a dielectric structure).

The capacitive sensor system may either be operated with the aid of pulsed electrical signals (so-called pulsed operation) or with the aid of sinusoidal signals (so-called linear operation). The electrical signal output by the receiver electrodes, which is typically a voltage, in particular its amplitude, represents a measure of the capacitance of the sensor and thus of the physical value to be measured. In linear operation, harmonics advantageously do not occur and essentially no undesired interference may thus arise. Furthermore, narrowband filters may be used for the signal processing. This results in a simple way in an improvement of the signal to noise ratio and the sensitivity of the sensor and/or the sensor system. Thus, small changes of the capacitance of the sensor system may also be established. The present invention relates in particular to systems for measuring a physical value which may be operated using sinusoidal signals.

The sensor system may be operated both grounded on one side and also floating. In grounded operation of sensors which are situated closely adjacent, a signal voltage typically occurs at the ungrounded electrode which may cause crosstalk by parasitic capacitive coupling to the ungrounded electrode of an adjacent sensor. This crosstalk may advantageously be avoided by a floating operation of the sensor system.

FIG. 2a) shows a schematic illustration of a system, which is operated grounded, for measuring a physical value having a measuring sensor 3, reference sensor 4, and a control/analysis unit 5, which analyzes the output signals of the measuring sensor 3 and the reference sensor 4 and outputs an output signal $V_{out}$ corresponding to the physical value. The illustrated system is operated using a voltage $V_{pos}$. The measuring sensor 3 and the reference sensor 4 each have a capacitor having a transmitter electrode 6 and a receiver electrode 7. The terminal of the particular transmitter electrode 6 is grounded. The terminals of the receiver electrodes 7 form the outputs of the measuring sensor 3 and the reference sensor 4. The control/analysis unit 5 calculates a difference from the output signals of the measuring sensor 3 and the reference sensor 4, using which the physical value to be measured may be ascertained.

FIG. 2b) shows a system for measuring a physical value, which is operated floating. A measuring sensor 8 and a reference sensor 9 are provided, which each have a transmitter electrode 10, a receiver electrode 11, and receiving electronics 12. Receiving electronics 12 are connected in each case to a receiver electrode 11 and processes the signal output thereby. A control/analysis unit 13 evaluates the output signals of the receiving electronics 12, calculates their difference in particular, and ascertains therefrom an output signal $V_{out}$, which corresponds to the physical value to be measured. A signal source 14 is provided, which supplies the measuring sensor 8 and the reference sensor 9 with power.

More than one measuring sensor 8 may be provided. FIG. 3 shows an example of a system having one reference sensor 9 and three measuring sensors 8, which are operated floating.

In sensor systems having multiple capacitive sensors, crosstalk capacitances frequently occur, which may corrupt the measuring results. FIG. 4 schematically shows a sensor system, which is operated floating, having multiple capacitive sensors as a concentrated capacitance model. For example, a sensor system having four (measuring) sensors, i.e., having one transmitter electrode S and four receiver electrodes E1, E2, E3, E4, is shown. The capacitances $C_{s1}, C_{s2}, C_{s3}, C_{s4}$, represent the sensor capacitances. The further capacitances shown in the capacitance model are parasitic and have a corrupting effect on the measurement results. These are the four parallel capacitances $C_{p1}, C_{p2}, C_{p3}, C_{p4}$, which lead from the receiver electrodes E1, E2, E3, E4 to ground, and six crosstalk capacitances $C_{X12}, C_{X23}, C_{X34}, C_{X13}, C_{X24}, C_{X14}$, which represent the capacitive couplings between the receiver electrodes E1, E2, E3, E4. The parallel capacitance $C_{p0}$, which leads from the transmitter electrode S to ground, is essentially inactive if the transmitter electrode is powered from a low-resistance voltage source. Each of the receiver electrodes E1, E2, E3, E4 is connected to receiving electronics (not shown), which processes the output signal of the particular receiver electrodes E1, E2, E3, E4 and provides the processed signal to a control/analysis unit (not shown).

The number of parasitic capacitances to be considered in the capacitance model calculation is a function of how precise the capacitance model is to be. Crosstalk capacitances between receiver electrodes situated at a large spatial distance are typically small in comparison to the remaining capacitances of the model and therefore may often be neglected. Typically, it is sufficient to consider the crosstalk capacitances for the closest and next-to-closest receiver electrode, viewed spatially, in the capacitance model.

The parasitic capacitances $C_p$, $C_X$ have the following effects, which act negatively on the measuring results: the parallel capacitances $C_p$ each form, together with the associated sensor capacitance $C_s$, a voltage divider, which results in a decrease of the amplitude of the output signal and thus a reduction of signal-to-noise ratio and the measuring precision. The crosstalk capacitances $C_X$ represent couplings between adjacent receiver electrodes. Each signal received by a receiver electrode is overlaid via the particular crosstalk capacitances with components of signals received by the adjacent receiver electrodes, which results in a corruption of the amplitude of the output signals and thus in a spatial resolution loss.

If the geometric system of the transmitter electrode and the receiver electrode is known, with the aid of the finite element method (FEM), the capacitance values of the capacitance model shown in FIG. 4 may be calculated. If the capacitance model having the capacitance values and the construction of the receiving electronics are known, the signals prepared by the receiving electronics may be calculated either analytically or with the aid of a circuit simulator. In this way, the signals processed by the various receiving electronics may be compared to one another. This allows a comparison of various systems for measuring a physical value, which each comprise a sensor system having multiple capacitive sensors and receiving electronics associated therewith. Known systems for measuring a physical value typically provide signals which are influenced by parallel capacitances $C_p$ and/or by the crosstalk capacitances $C_X$.

A system for measuring a physical value is shown in FIGS. 5 and 6, in which, for example, four receiver electrodes E1, E2, E3, E4 are situated spatially adjacent to one another opposite to a transmitter electrode S. Cables (not shown in greater detail), which are provided with shielding 15, lead from the receiver electrodes E1, E2, E3, E4 to the receiving electronics (not shown in greater detail in FIG. 5). The shielding 15 is grounded and forms the parasitic parallel capacitance between receiver electrode and ground. FIG. 6 shows the block diagram, corresponding to the system in FIG. 5, for a system having a receiver electrode E. The sensor capacitance $C_s$ is between the transmitter electrode S and the receiver electrode E. The receiving electronics downstream from the receiver electrode E are formed by an amplifier having a high-resistance input, such as a voltage follower having an amplification 1, and a resistor $R_1$, connected upstream therefrom, which connects the receiver electrode E to ground. Because no shielding may be attached in the direction of the transmitter electrode S, the effect of the shielding 15 remains incomplete, so that crosstalk capacitances remain between the receiver electrodes. The signals received by the receiver electrodes are thus corrupted as a result of the crosstalk in spite of shielding 15.

Together with the resistor $R_1$, the sensor capacitance $C_s$ forms a high-pass filter. Taking the parallel capacitance $C_p$ between transmitter electrode S and ground into consideration, the transmission function for the high-pass filter results as a Laplace transform as:

$$G(s) = \frac{C_s}{C_s + C_p} \cdot \frac{sT}{1 + sT}$$

with the time constant $T=R_1(C_s+C_p)$. For an operating frequency of the (measuring) sensor of 300 kHz, i.e., the feed voltage or operating voltage of the sensor has a frequency of 300 kHz, a sensor capacitance $C_s$ of 4 pF or 6 pF and a parallel capacitance $C_p$ of 0 pF, the amplitude responses in FIG. 7 result. The lower amplitude response in FIG. 7 corresponds to a sensor capacitance of 4 pF and the upper amplitude response corresponds to a sensor capacitance of 6 pF. Two amplitude responses are shown at different sensor capacitances, in order to make it clear how a sensor capacitance change affects the output signal of the block diagram shown in FIG. 6. In the event of real changes, for example, in pipetting applications, the sensor capacitance changes may be in the range of a few femtofarads.

It is shown in FIG. 7 that for a dependence of the amplitude of the output signal on the sensor capacitance $C_s$, the operating frequency of the sensor must be selected as less than the limiting frequency of the transmission function specified above, i.e., less than the limiting frequency of the high-pass filter. For a parallel capacitance $C_p$ of 0 pF, a limiting frequency of $f=1/(2\pi R_1 C_s)$ results. For a parallel capacitance $C_p$ of greater than 0 F, an attenuated amplitude of the output signal results, as results from FIG. 8 for a parallel capacitance $C_p$ of 50 pF. The limiting frequency f for this case is $f=1/(2\pi R_1(C_s+C_p))$. In the event of operation at an operating frequency below the limiting frequency, the amplitude of the output signal is a function of the operating frequency. However, this requires good stabilization of the operating frequency.

A system for measuring a physical value is shown in FIGS. 9 and 10, in which the shielding 15 is at the same potential as the output of the amplifier IOP1, which the receiving electronics comprise (so-called "guarding"). The shielding 15 is thus driven by the output signal of the amplifier IOP1. FIG. 11 shows the amplitude responses for a sensor capacitance $C_s$ of 4 pF or 6 pF and a parallel capacitance $C_p$ of 50 pF. It is obvious that the parallel capacitance $C_p$ no longer has an influence on the amplitude of the output signal of the block diagram showing FIG. 10. The transmission function results as a Laplace transform as:

$$G(s) = \frac{sT}{1 + sT}$$

with the time constant $T=R_1C_s$. The effect of the parallel capacitance $C_p$ which corrupts the output signal may thus be avoided, but the influence of the crosstalk 16 and/or the crosstalk capacitances between adjacent receiver electrodes on the output signal remains. It results from FIG. 11 that the operating frequency must be less than the limiting frequency of the transmission function, so that a change of the sensor capacitance has an effect on the output signal. However, in the frequency range below the limiting frequency, the amplitude of the output signal is a function of the operating frequency, which requires good stabilization of the operating frequency.

FIG. 12 shows the block diagram of a further system for measuring a physical value, in which the capacitive measuring sensor is operated grounded, i.e., one electrode of the measuring sensor is applied to ground, while the other is simultaneously operated as the transceiver electrode ES. The electrode is operated voltage-controlled. The receiving electronics associated with the electrode thus simultaneously assume the function of transmitting electronics. The measuring signal of the measuring sensor is applied to the non-inverting input of an operational amplifier IOP1 of the receiving electronics. The sensor capacitance $C_{s1}$ and the parallel capacitance $C_{p1}$ of the sensor are between the inverting input of the operational amplifier IOP1 and ground in a parallel circuit. A resistor $R_{F1}$ and a compensation capacitance $C_{comp}$ of the receiving electronics are between the output of the operational amplifier IOP1 and its inverting input in a parallel circuit. A compensation of the frequency and/or phase responses may be achieved via the selection of the compensation capacitance $C_{comp}$ and oscillations may thus be avoided. In this way, a capacitive crosstalk 16 of receiving/transmitter electrodes ES which are situated adjacent may thus again be suppressed. The transmission function of the block diagram shown in FIG. 12 as a Laplace transform reads:

$$G(s) = \frac{\frac{R_{F1}}{1+sR_{F1}C_{comp}}+1}{\frac{1}{s(C_s+C_{p1})}}$$

$$= \frac{sR_{F1}(C_{s1}+C_{p1})}{1+sR_{F1}C_{comp}}+1$$

$$= \frac{1+sR_{F1}C_{comp}+sR_{F1}(C_{s1}+C_{p1})}{1+sR_{F1}C_{comp}}$$

$$= \frac{1+sR_{F1}(C_{comp}+C_{s1}+C_{p1})}{1+sR_{F1}C_{comp}}$$

$$G(s) = \frac{1+sR_{F1}(C_{comp}+C_{s1}+C_{p1})}{1+sR_{F1}C_{comp}}$$

For very high frequencies, the transmission function simplifies to:

$$G(s)|_{s\to\infty} = \frac{V_{out}}{V_{in}} = \frac{C_{comp}+C_{s1}+C_{p1}}{C_{comp}}$$

With a sensor capacitance $C_{s1}$ and a compensation capacitance $C_{comp}$ of 4 pF or 6 pF in each case, a parallel capacitance $C_{p1}$ of 50 pF, and a resistance $R_{F1}$ of 33 k ohms, the amplitude responses shown in FIG. 13 result. For high frequencies, an amplification of 14.5 (corresponding to 23.2 dB) results for both sensor capacitance values. For high parallel capacitances $C_{p1}$, in particular if $C_{p1}>>C_{s1}$, a large output amplitude therefore results, while the relative change of the output amplitude decreases upon change of the sensor capacitance $C_{s1}$. The parallel capacitance $C_{p1}$ thus has an unfavorable effect on the ascertainment of the sensor capacitance change.

The influence of the crosstalk 16, in contrast, may be reduced using the system shown in FIG. 12, because the transceiver electrode ES is operated with low resistance as a result of the counter coupling. In order to achieve sufficient suppression of the crosstalk, a large amplification-bandwidth product is required from the operational amplifier IOP1 in FIG. 12 (so-called gain-bandwidth product). At an operating frequency of 10 MHz and a required amplification of 100, an amplification-bandwidth product of 10 MHz×100× 14.5=14.5 GHz results, which cannot be implemented using standard operational amplifiers. The factor 14.5 corresponds to an amplification value of 23.2 dB at 10 MHz according to FIG. 13. At a reduced operating frequency of 300 kHz, an amplification-bandwidth product of 0.3 MHz×100×4=120 MHz results, which may be implemented well, the factor 4 corresponding to an amplification of 12 dB at 300 kHz (compare FIG. 13). At an operating frequency of 300 kHz, i.e., below the limiting frequency of the system shown in FIG. 12, however, the output signal is a function of the operating frequency, which requires good stabilization of the operating frequency.

FIG. 14 shows a further known system for measuring a physical value, in which the receiver electrodes are connected to the inverting input of an inverting amplifier or operational amplifier IOP1 of receiving electronics. The inverting amplifier IOP1 controls its output, in the event of counter coupling, so that the differential voltage at its inputs is kept at zero. It may therefore be assumed that ground potential results at the inverting input. The inverting input is therefore also referred to as virtual ground. The sensor capacitance $C_s$ is then between the signal voltage $V_{in}$ and the virtual ground and a parallel circuit made of a compensation capacitance $C_k$ and a resistor $R_F$, which has the receiving electronics, is between the output of the inverting amplifier IOP1 and the virtual ground. The parallel capacitance $C_p$ is between the virtual ground and the actual ground. As a result thereof, the current which flows through the parallel capacitance $C_p$ disappears, so that the parallel capacitance $C_p$ is inactive.

The system shown in FIG. 14 is used, for example, as an input amplifier for photodiodes, whose parallel capacitance is to be made inactive, or in a capacitive sensor, where it is also to be used to remove the effect of the parallel capacitance.

The transmission function of the block diagram shown in FIG. 14 as a Laplace transform reads:

$$G(s) = \frac{\frac{R_F}{1+sR_FC_k}}{\frac{1}{sC_s}} = \frac{sR_FC_s}{1+sR_FC_k} = -\frac{C_s}{C_k} \cdot \frac{sR_FC_s}{1+sR_FC_k}$$

With a sensor capacitance $C_s$ of 4 pF or 6 pF, a compensation capacitance $C_k$ of 4 pF, a resistance $R_F$ of 33 k ohm, and a parallel capacitance $C_p$ of 50 pF, the amplitude responses shown in FIG. 15 result. The amplitude of the output signal is independent of the operating frequency if the operating frequency is selected above the limiting frequency of the system shown in FIG. 14, which is implemented as a high-pass filter, i.e., the operating frequency must be greater than $1/(2\pi R_F C_k)$ =1.2 MHz. This requires a system having a large amplification-bandwidth product.

DESCRIPTION OF THE INVENTION

It is the object of the present invention to provide a system for measuring a physical value having multiple measuring sensors, using which the influence of crosstalk between adjacent measuring sensors may be decreased.

This object is achieved by a system having the features of claim 1.

The system according to the invention is characterized in that an inverting measuring signal amplifier is connected downstream from each measuring sensor, one output of a measuring sensor being connected to one negative input of the inverting measuring signal amplifier connected downstream from the measuring sensor in each case. The multiple measuring sensors are preferably capacitive sensors, which are preferably formed by one transmitter electrode and multiple receiver electrodes, the receiver electrodes being situated spaced apart from the transmitter electrode. Alternatively, the transmitter electrode and the receiver electrodes may also be exchanged, so that the sensors are formed by one receiver electrode and multiple transmitter electrodes.

The inverting input of an inverting measuring signal amplifier represents a virtual ground. The outputs of the measuring sensors, in particular the receiver electrodes of the measuring sensors, are thus virtually grounded. This advantageously has the result that a capacitive crosstalk between adjacent measuring sensor outputs, in particular between adjacent receiver electrodes, may be reduced. In addition, the influence of a parasitic parallel capacitance between a measuring sensor output and/or a receiver electrode and ground is reduced.

In a preferred design, an integrator is connected downstream from each inverting measuring signal amplifier, to whose inverting input an output signal of the particular inverting measuring signal amplifier is applied.

In this way, the output signal of the system according to the invention may advantageously be essentially independent of the operating frequency. This results in a reduced aging and temperature drift. Furthermore, a low-pass behavior of the system is achieved for the upper operating frequency range, so that high-frequency noise may be suppressed.

According to a further preferred design of the invention, a reference signal generator is associated with each measuring sensor, in particular a reference sensor, to which an inverting reference signal amplifier is connected downstream, one output of the reference signal generator being connected to an inverting input of the inverting reference signal amplifier. The reference signal generated by the reference signal generator preferably has the same frequency and the same phasing as the measuring signal generated by the measuring sensor and its amplitude corresponds to that of the measuring signal when the measuring signal is in the idle or reference state.

By subtracting the output signal of the inverting reference signal amplifier from the output signal of the inverting measuring signal amplifier, a signal may be ascertained which corresponds to the change of the sensor capacitance and is of substantially lesser magnitude than the measuring signal or the reference signal. Because of its low amplitude, the differential signal may be provided to a control/analysis unit with a high amplification, without the danger of overload. Furthermore, the differential signal is more sensitive to a change of the sensor capacitance than the measuring signal of the measuring sensor. The danger of crosstalk between the lines which connect the receiving electronics 12 (compare FIG. 2) to the control/analysis unit 13 (compare FIG. 2) is reduced, because the signal amplitudes are less.

BRIEF DESCRIPTION OF THE DRAWINGS

Further advantageous designed to the invention result from the subclaims and the exemplary embodiments illustrated hereafter on the basis of the drawings. In the figures:

In the figures, identical reference numerals denote structurally or functionally equivalent components. In the value specifications of electronic components specified in the block diagrams, the specification of the unit was dispensed with for the sake of simplicity.

DETAILED DESCRIPTION OF THE EXEMPLARY EMBODIMENTS

FIGS. 1-15 have already been described in the introduction to the description. Reference is made at this point to the introduction to the description.

Figure 1:
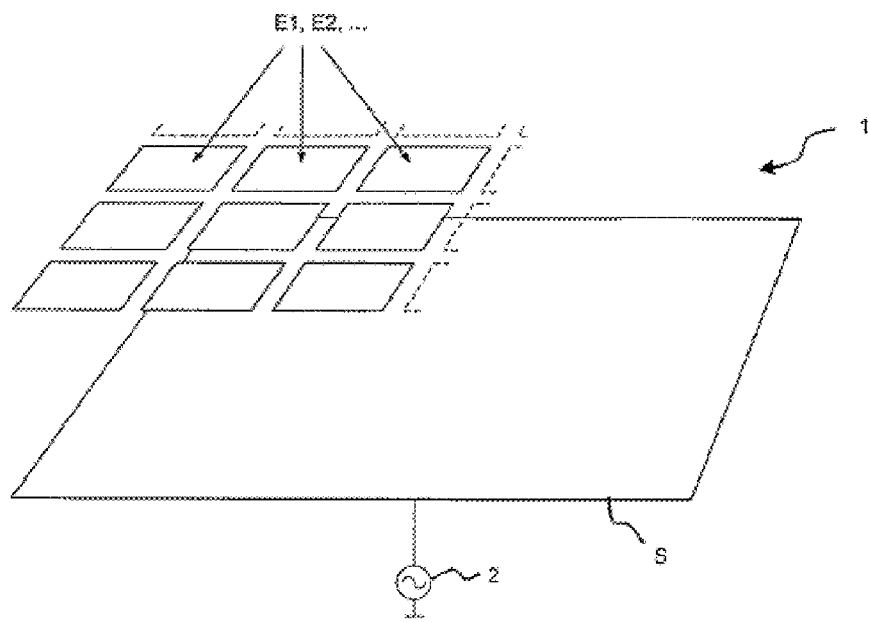
FIG. 1 shows a schematic illustration of a sensor system having multiple capacitive sensors.
Figure 2:
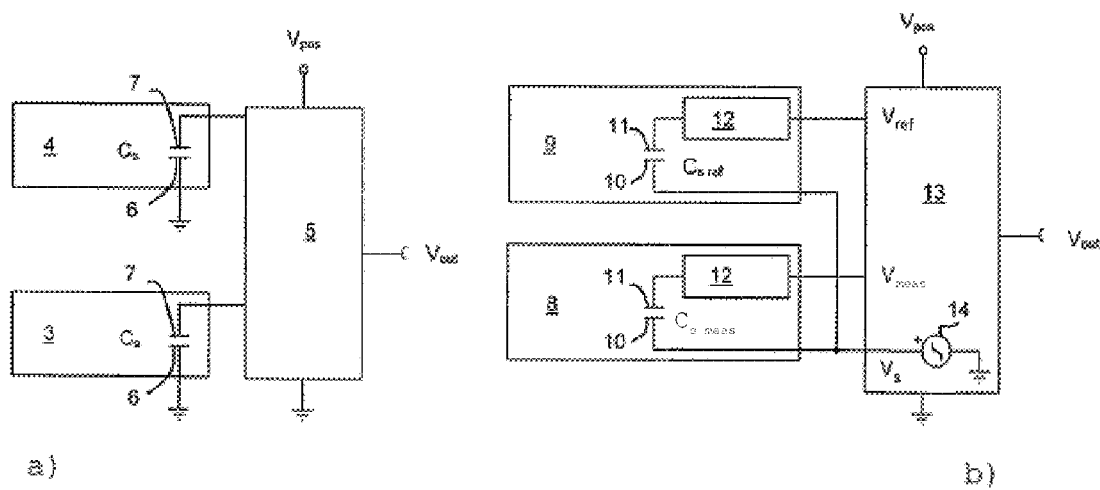
FIG. 2 shows a block diagram of a system for measuring a physical value, which is operated grounded (a), and a block diagram of a system for measuring a physical value, which is operated floating (b)
Figure 3:
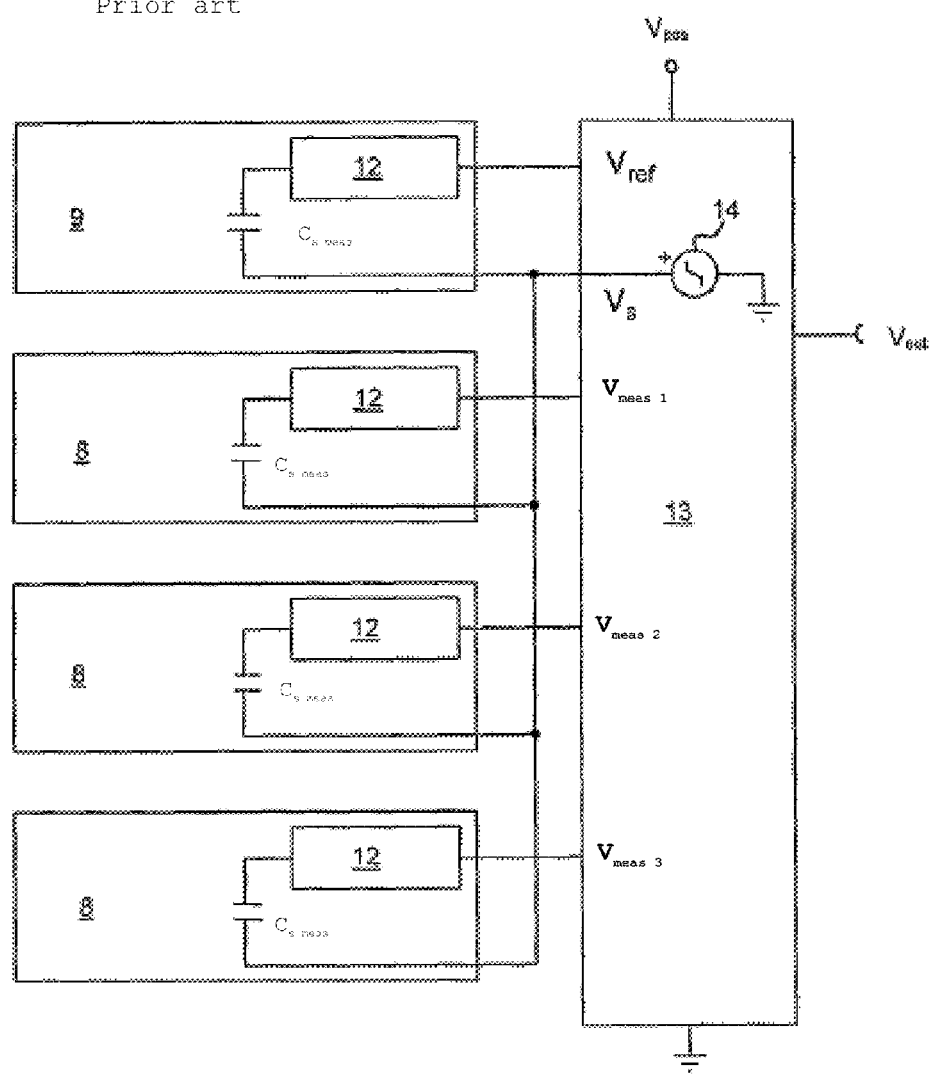
FIG. 3 shows a block diagram of a system for measuring a physical value, which is operated floating and comprises multiple measuring sensors.
Figure 4:
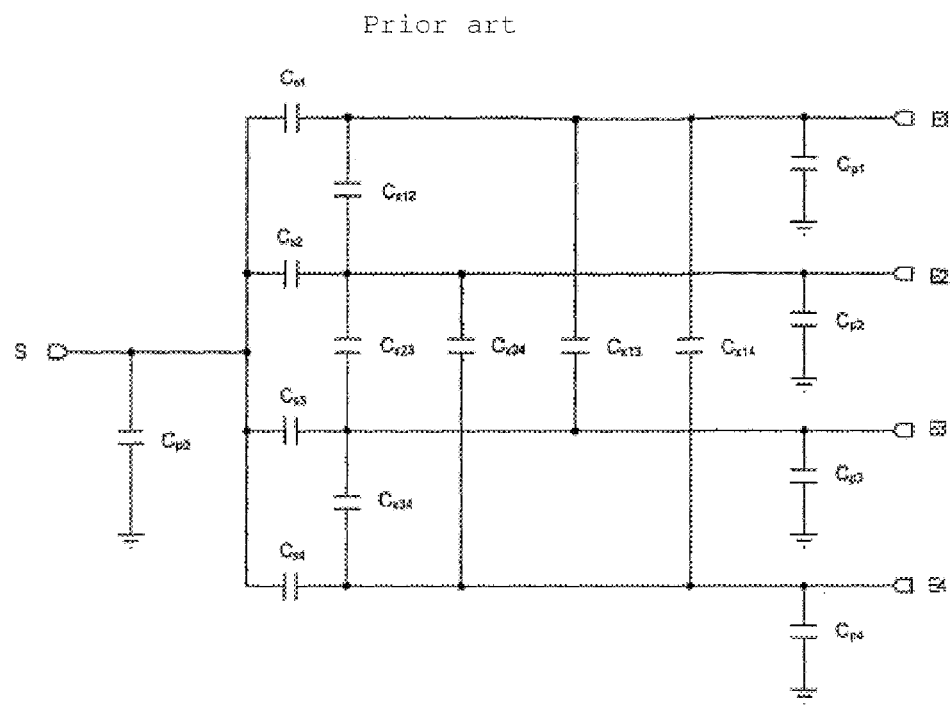
FIG. 4 shows a capacitance model of a sensor system having multiple sensors.
Figure 5:
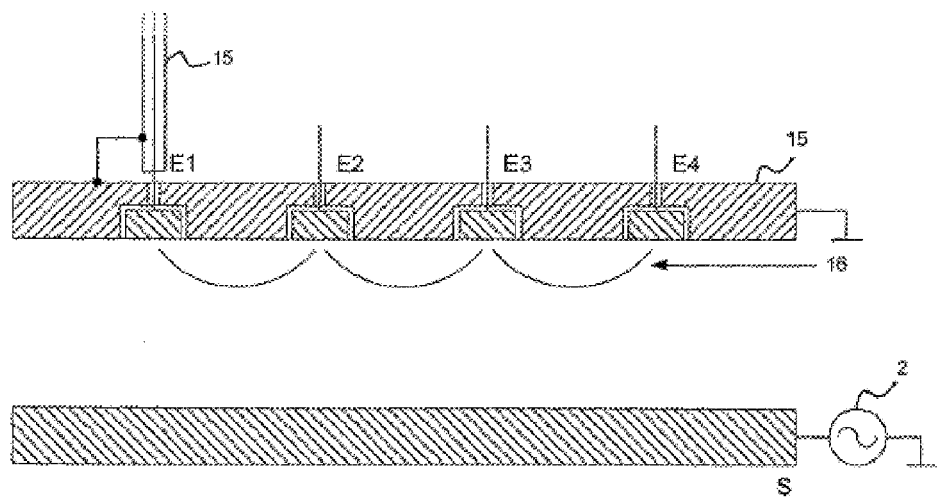
FIG. 5 shows a schematic illustration of a sensor system having multiple sensors, in which the receiver electrodes have shielding.
Figure 6:
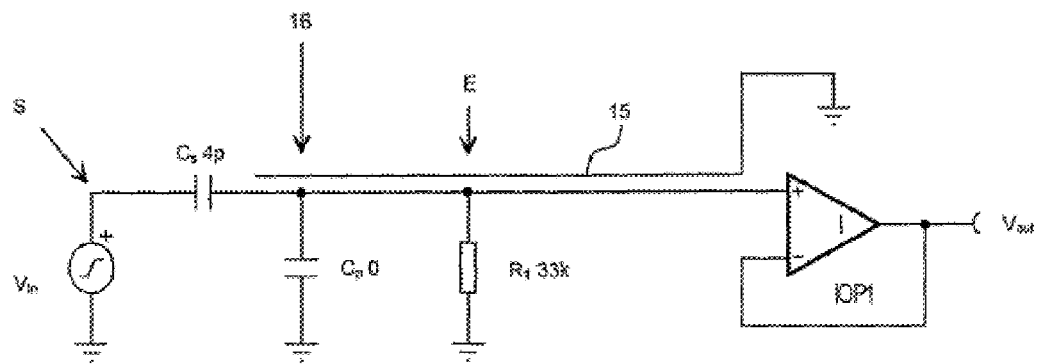
FIG. 6 shows a block diagram relating to the sensor system from FIG. 5.
Figure 7:
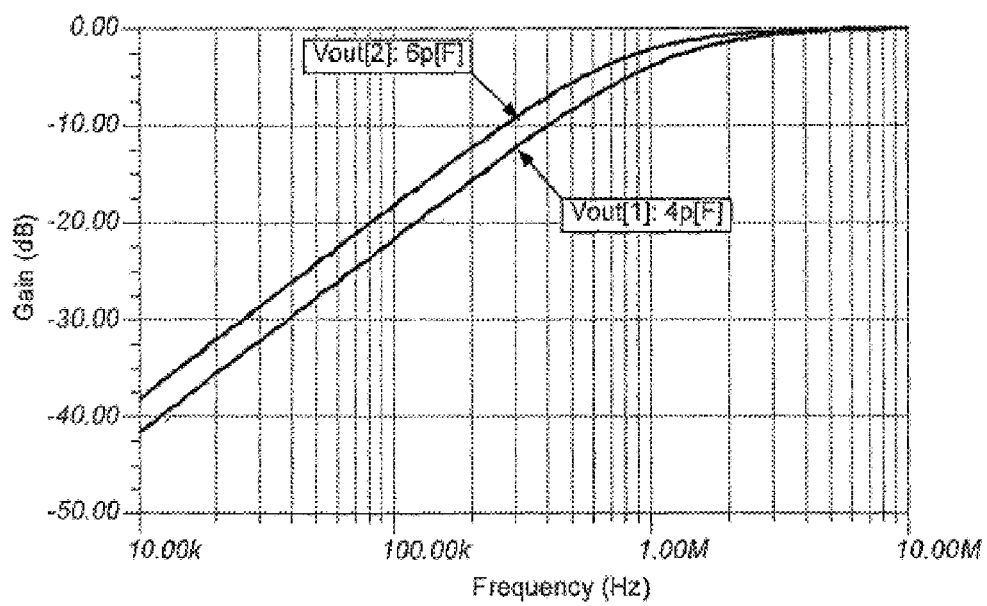
FIG. 7 shows a diagram having amplitude responses of the block diagram shown in FIG. 6.
Figure 8:
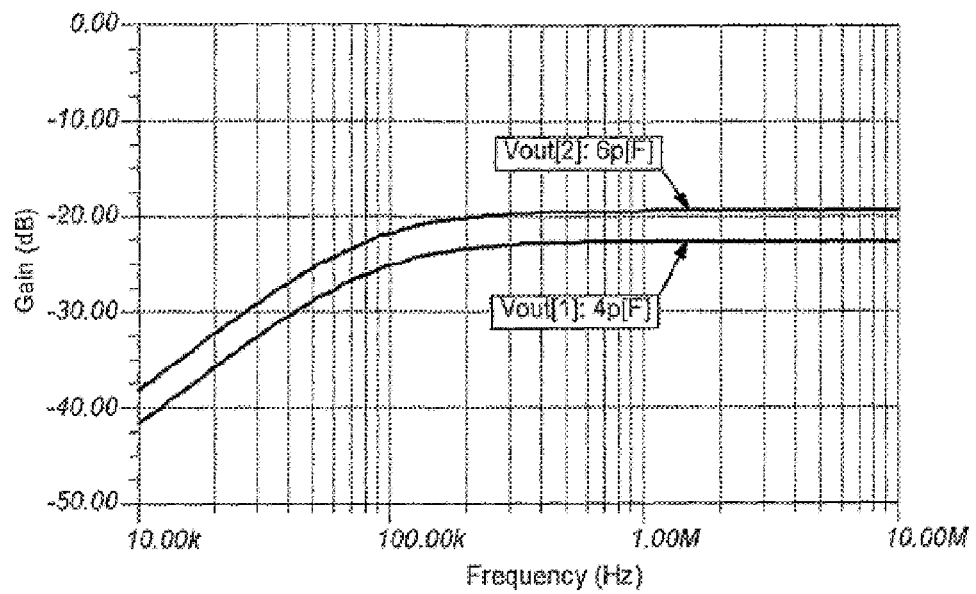
FIG. 8 shows a further diagram having amplitude responses of the block diagram from FIG. 6.
Figure 9:
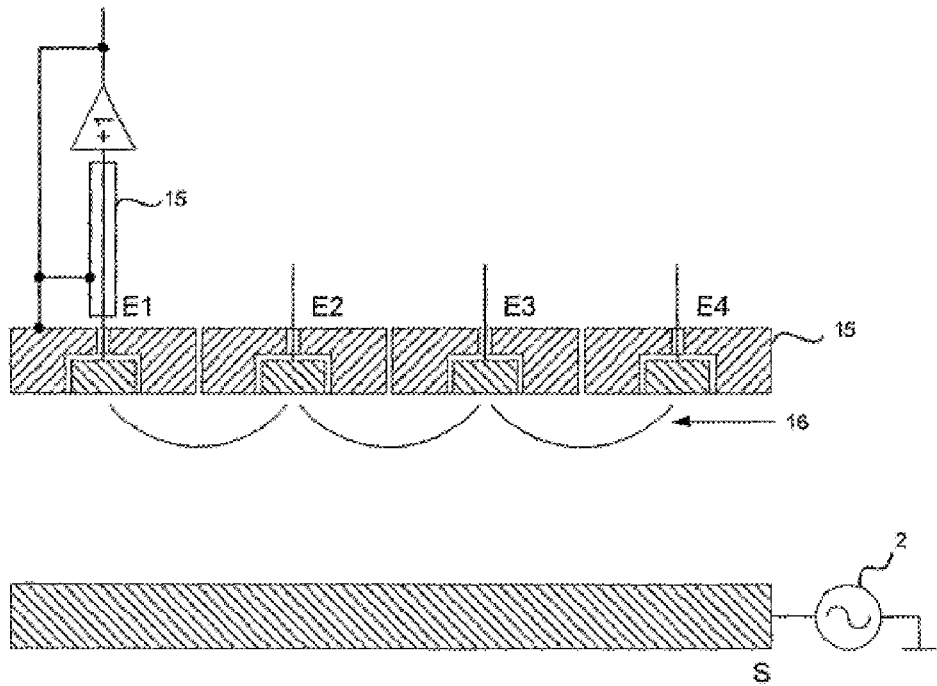
FIG. 9 shows a schematic illustration of a sensor system having multiple capacitive sensors with guarding of the receiver electrodes.
Figure 10:
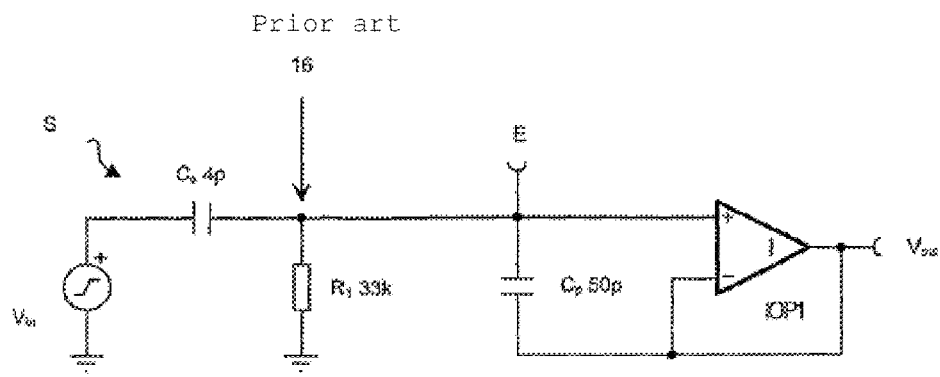
FIG. 10 shows a block diagram of the system from FIG. 9.
Figure 11:
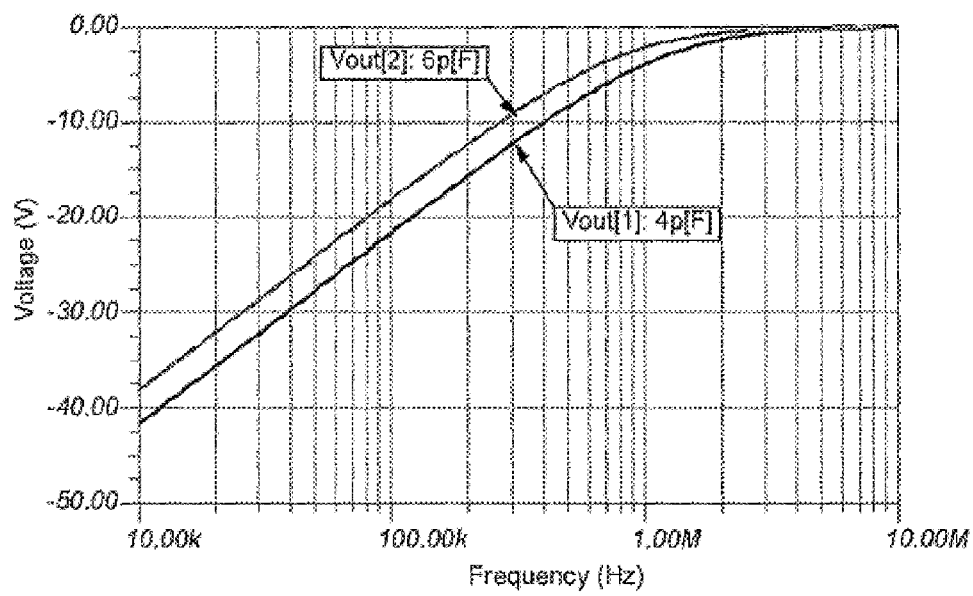
FIG. 11 shows a diagram having amplitude responses of the block diagram from FIG. 10.
Figure 12:
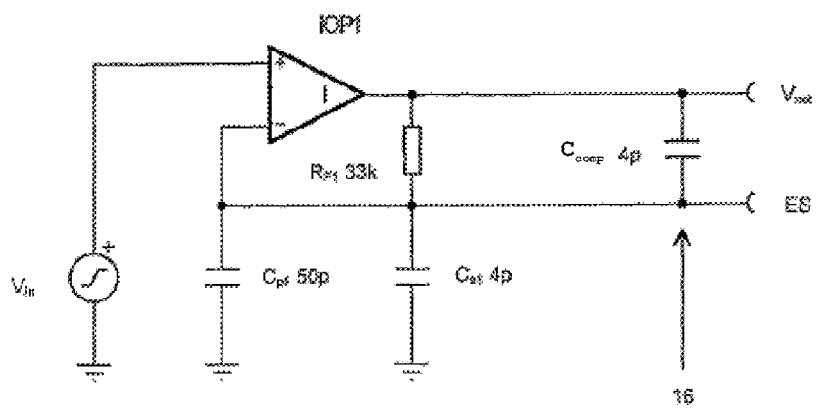
FIG. 12 shows a block diagram of a sensor system in which the electrodes are voltage-controlled.
Figure 13:
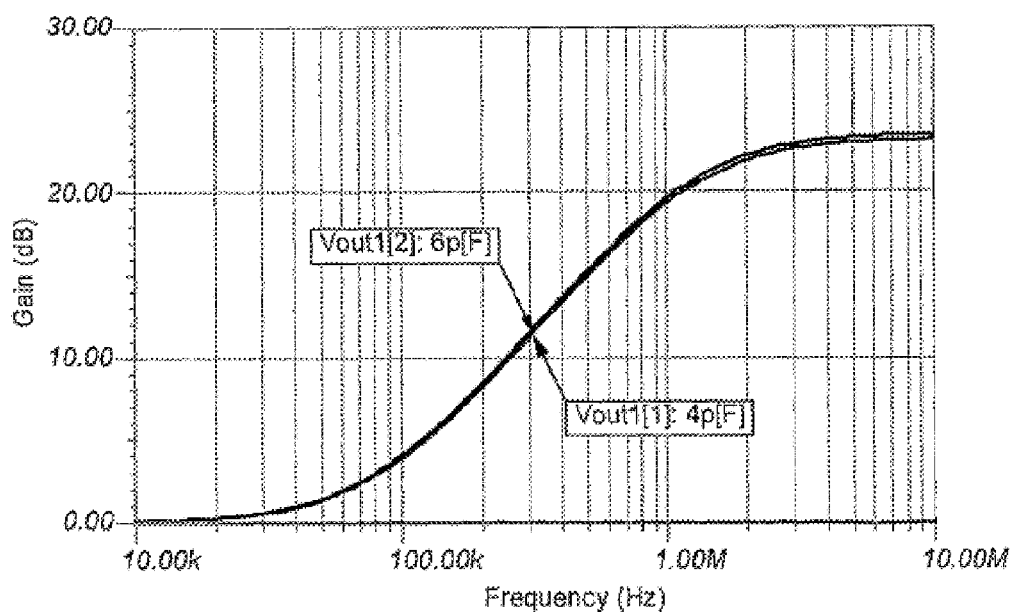
FIG. 13 shows a diagram having amplitude responses of the block diagram from FIG. 12.
Figure 14:
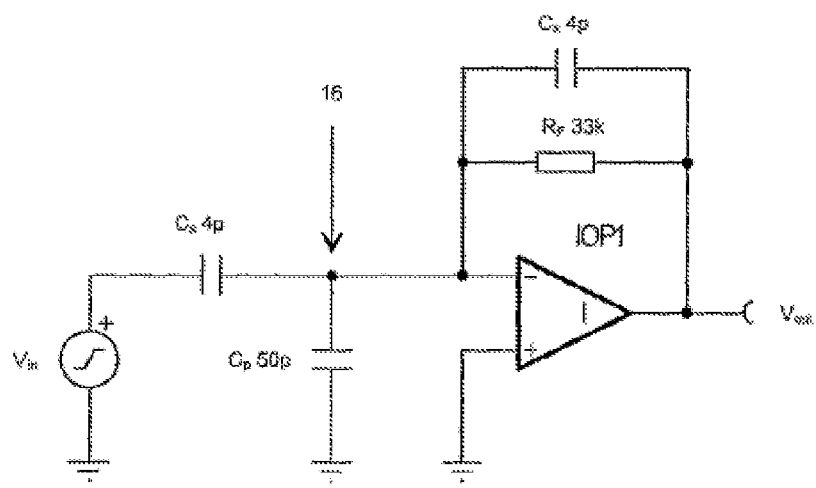
FIG. 14 shows a block diagram of a sensor system having an inverting amplifier.
Figure 15:
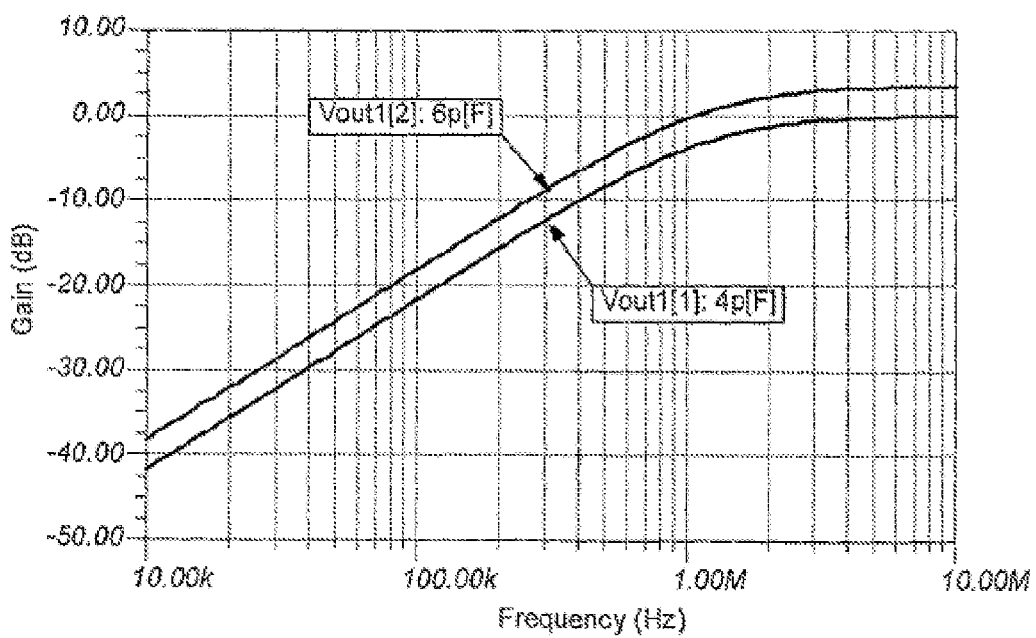
FIG. 15 shows a diagram having amplitude responses of the block diagram from FIG. 14.
Figure 16:
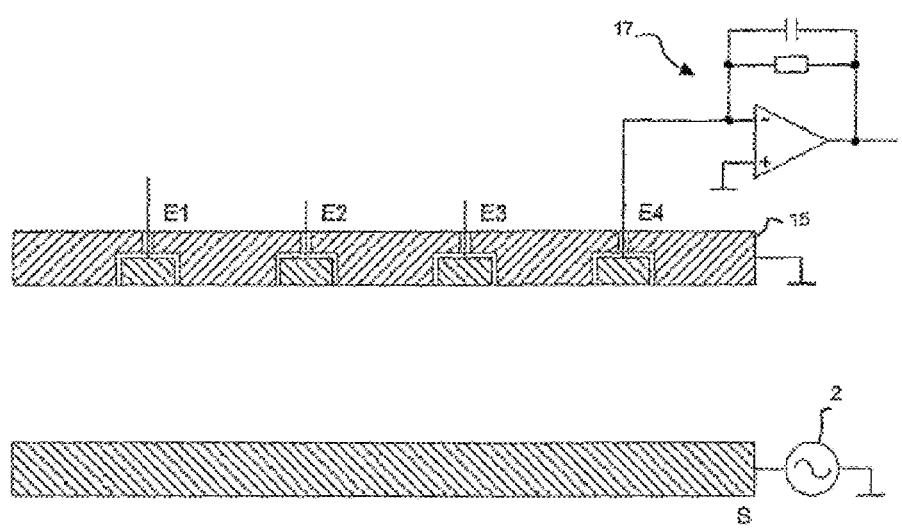
FIG. 16 shows a schematic illustration of the system according to the invention for measuring a physical value having multiple measuring sensors, an inverting measuring signal amplifier being associated with each measuring sensor.

FIG. 16 shows a system according to the invention for measuring a physical value having multiple measuring sensors, each measuring sensor being designed as a capacitive sensor and the measuring sensors being formed by one transmitter electrode S and multiple receiver electrodes E1, E2, E3, E4. The receiver electrodes E1, E2, E3, E4 are situated spaced apart from the transmitter electrode S. A power supply source 2 is provided, which is connected to the transmitter electrode S. The receiver electrodes E1, E2, E3, E4 are situated in a spatial plane, the so-called receiving plane.

In particular in the event of greater intervals between the receiver electrodes E1, E2, E3, E4 in the receiving plane, shielding 15 may be provided between them in the form of a ground surface, which is grounded. In this way, a homogeneous alternating field may be ensured between the transmitter electrode 2 and the receiving plane, which is a requirement for error-free scanning of arbitrary objects in the intermediate space between the transmitter electrode S and the receiving plane, because the homogeneous alternating field is only to be influenced by an object to be detected.

An inverting measuring signal amplifier 17 is connected as receiving electronics at the output of each measuring sensor, i.e., at each receiver electrode E1, E2, E3, E4. For the sake of simplicity of the illustration, in FIG. 16 only the inverting measuring signal amplifier 17 connected to the receiver electrode E4 is shown. Corresponding inverting measuring signal amplifiers are connected as receiving electronics (not shown) to the receiver electrodes E1, E2, E3. The receiver electrodes E1, E2, E3, E4 are connected to the inverting inputs of the particular inverting measuring signal amplifier 17. Because the inverting inputs of the inverting measuring signal amplifiers 17 represent virtual grounds, parasitic parallel capacitances, which arise between the receiver electrodes E1, E2, E3, E4 and the shielding 15, remain inactive, because the receiver electrodes E1, E2, E3, E4 are virtually grounded via the virtual grounds.

Figure 17:
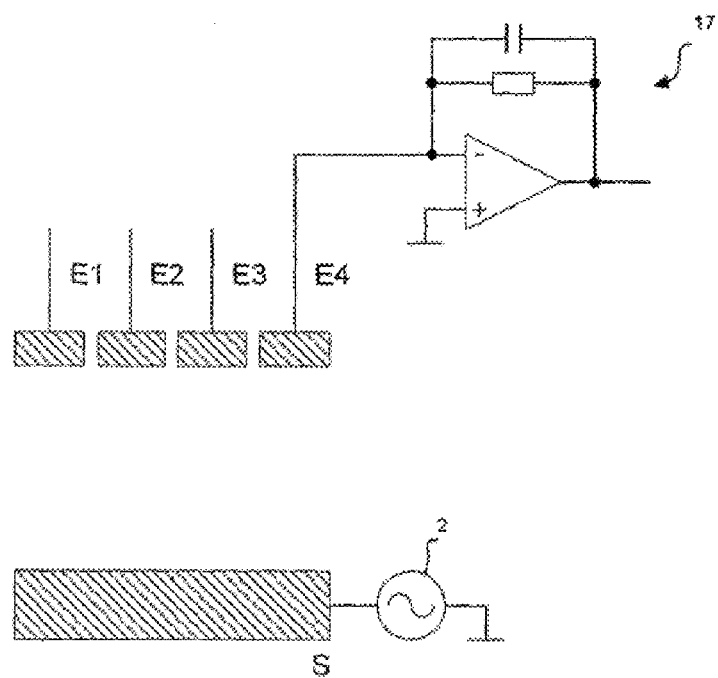
FIG. 17 shows a schematic illustration of a system according to FIG. 16 without shielding of the receiver electrodes of the measuring sensors.

Capacitive crosstalk cannot occur between the receiver electrodes E1, E2, E3, E4, because all receiver electrodes E1, E2, E3, E4 are virtually grounded. For this reason, the shielding 15 between the receiver electrodes E1, E2, E3, E4 may be dispensed with. This is shown in FIG. 17. In FIG. 17, for the sake of simplicity, only the inverting measuring signal amplifier connected to the receiver electrode E4 is shown. The receiver electrodes E1, E2, E3 are connected to corresponding inverting measuring signal amplifiers 17 (not shown). By dispensing with the shielding 15, the receiver electrodes E1, E2, E3, E4 may be moved closer to one another in the receiving plane, which increases their density per unit area and thus the spatial resolution of the system having multiple capacitive sensors. The receiving plane may be exploited better in this way.

Figure 18:
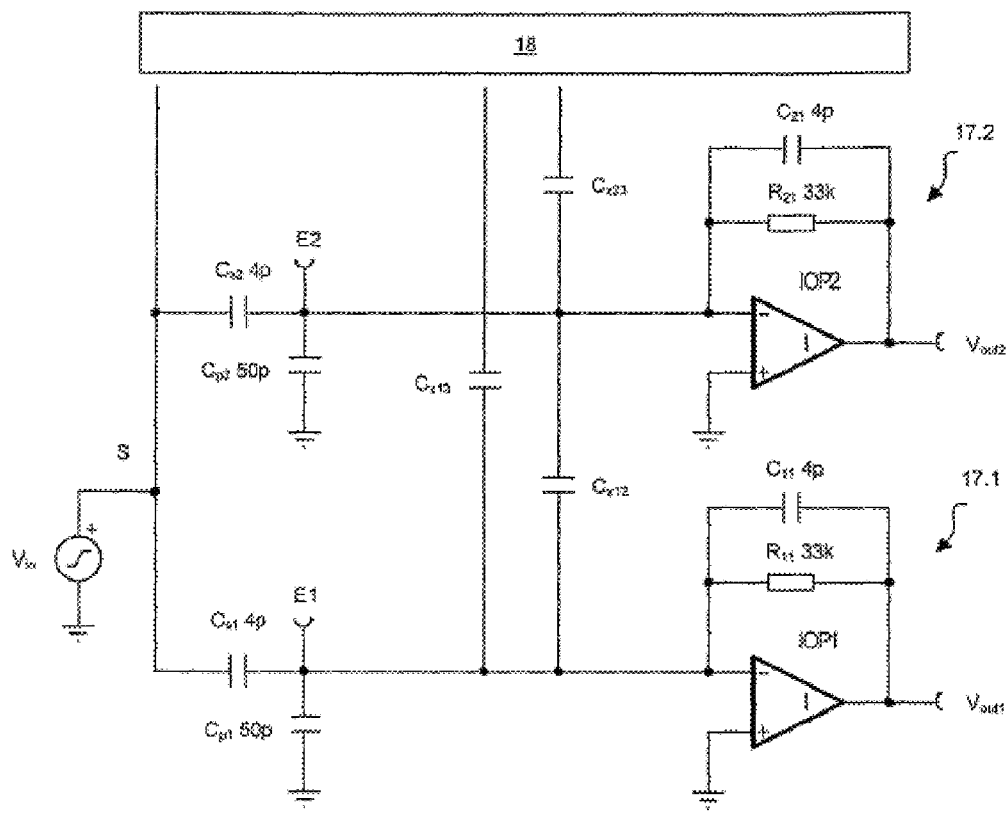
FIG. 18 shows a block diagram of the system from FIG. 17 having parasitic capacitances.

FIG. 18 shows a block diagram of a system according to the invention for measuring a physical value according to FIG. 17. A shared transmitter electrode S is provided for all measuring sensors. Furthermore, the receiver electrodes E1 and E2 of two measuring sensors are explicitly shown. The receiver electrode E1 is connected to an inverting input of an inverting measuring signal amplifier 17.1, which forms receiving electronics. The electrode E2 is connected to an inverting input of an inverting measuring signal amplifier 17.2, which also forms receiving electronics. Block 18 symbolically represents further receiver electrodes E3, E4, . . . , having inverting measuring signal amplifiers and/or receiving electronics associated therewith. The counter coupling of the inverting measuring signal amplifier 17.1 is formed by a parallel circuit of the capacitor $C_{11}$ and the resistor $R_{11}$. The counter coupling of the inverting measuring signal amplifier 17.2 is formed by a capacitor $C_{21}$ and a resistor $R_{21}$. The first measuring sensor has a sensor capacitance $C_{s1}$. The second sensor has a sensor capacitance $C_{s2}$. The block diagram considers the crosstalk capacitances $C_{X12}$, $C_{X13}$, $C_{X23}$, . . . between the receiver electrodes E1, E2, . . . . The parallel capacitances $C_{p1}$ and $C_{p2}$ represent the capacitance of the line (not shown in greater detail) associated with the particular receiver electrode E1, E2 to the inverting measuring signal amplifier 17.1, 17.2 connected to the particular receiver electrode E1, E2 and its input capacitance. The capacitors $C_{11}$, $C_{12}$ are used for frequency compensation and avoiding oscillation.

Figure 19:
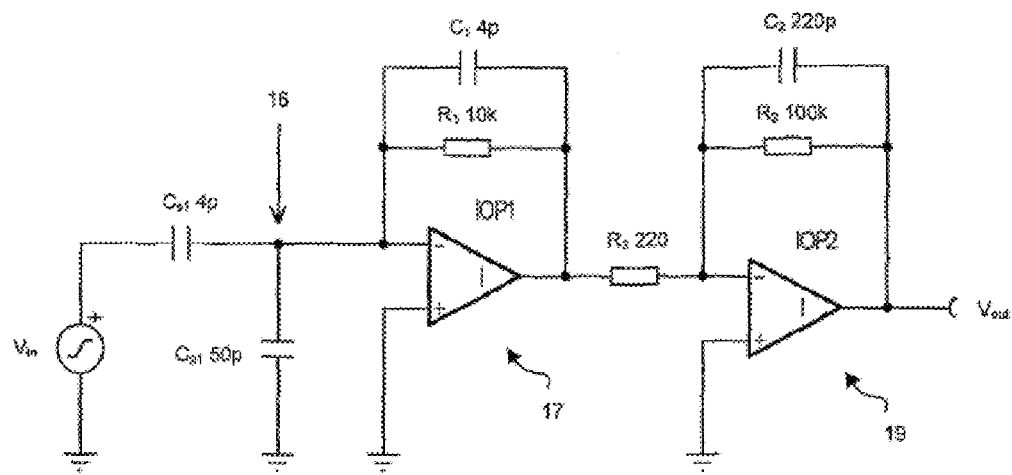
FIG. 19 shows a circuit diagram of a measuring sensor having downstream inverting measuring signal amplifier and downstream integrator.

FIG. 19 shows a circuit diagram of a system for measuring a physical value having a measuring sensor having a sensor capacitance $C_{s1}$, whose receiver electrode is connected to an inverting input of an inverting measuring signal amplifier 17. The counter coupling of the measuring signal amplifier 17 is formed by a parallel circuit of a capacitor $C_1$ and a resistor $R_1$. A parallel capacitance $C_{p1}$ between the inverting input of the inverting measuring signal amplifier 17 and ground is taken into consideration. The output of the inverting measuring signal amplifier 17 is connected via a resistor $R_3$ to the inverting input of an integrator 19. The counter coupling of the integrator forms a parallel circuit made of a capacitor $C_2$ and a resistor $R_2$. The inverting measuring signal amplifier 17, the integrator 19, and the resistor $R_3$ form receiving electronics. The transmission function of the system shown in the block diagram of FIG. 19 results as a Laplace transform as $$G(s) = \frac{C_{s1}}{C_1} \cdot \frac{sR_1C_1}{1+sR_1C_1} \cdot \frac{R_2}{R_3} \cdot \frac{1}{1+sR_2C_2}$$

Figure 20:
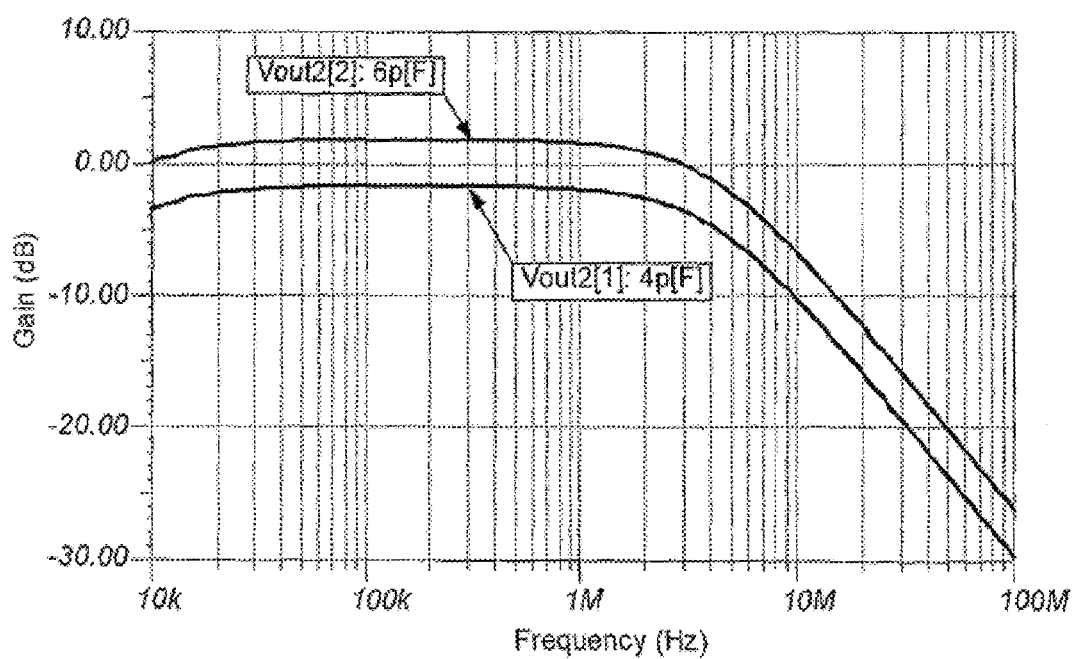
FIG. 20 shows a diagram having amplitude responses of the circuit diagram from FIG. 19.

For the values of the electronic components specified in FIG. 19, FIG. 20 shows the amplitude responses at a sensor capacitance $C_{s1}$ of 4 pF or 6 pF. The output signal of the system shown in FIG. 19 is advantageously barely dependent on the operating frequency in the frequency range from 20 kHz to 1 MHz. An operating frequency of 300 kHz is preferably used. The independence of the system shown in FIG. 19 on the operating frequency results in an increase of the long-term stability and the temperature independence, so that slight changes of the operating frequency, as may occur, for example, in oscillator circuits which are used for generating the operating signal, for example, as a result of age and temperature changes, essentially cannot influence the output signal of the system according to FIG. 19.

Changes of the sensor capacitance $C_{s1}$ are expressed in a sensor system having multiple capacitive measuring sensors as a change of the amplitude of the output signal. In sensitive measuring sensors, these changes may be very small, for example, ¹⁄₁₀,₀₀₀ of the amplitude of the (operating) signal. The signal output by the signal source 14 (compare FIG. 2b) or 2 (compare FIG. 17) to the measuring sensor may be viewed as a carrier signal, whose amplitude is modulated by the change of the sensor capacitance. Because only the modulation and/or change of the amplitude of the carrier signal and/or operating signal is of interest and not the amplitude of the carrier signal itself, the carrier signal may be suppressed during the determination of the sensor capacitance change. This may be performed, for example, using a control/analysis unit which is connected downstream from a system for measuring a physical value and the receiving electronics, which are connected downstream from the system. In systems having multiple sensors, the danger also exists that upon the transmission of the output signals to a control/analysis unit, undesired couplings of adjacent signal lines and/or crosstalk on adjacent signal lines will occur. For example, if only ¹⁄₁₀,₀₀₀ of the amplitude of the output signal of a measuring signal reaches the channel associated with an adjacent measuring sensor and/or its signal line, a relatively large measuring sensor capacity change is simulated on this channel.

The coupling of adjacent signal lines may be reduced strongly if the amplitude of the carrier signal is already entirely or partially suppressed in the receiving circuits associated with the measuring sensors. A partial suppression may be sufficient if the control/analysis unit downstream from the receiving electronics operates using carrier suppression.

The carrier signal or operating signal is preferably removed using a signal subtraction. For this purpose, a carrier or operating signal is needed, which is unmodulated, i.e., which is uninfluenced by a sensor capacitance change. The unmodulated carrier signal forms the reference signal $V_{ref}$. The frequency and phasing of the reference signal $V_{ref}$ preferably correspond to the frequency and phasing of the signal $V_{meas}$ measured by a measuring sensor. After the subtraction, an output signal of $$V_{out} = V_{meas} - V_{ref}$$

results, $V_{meas}$ being the signal measured using a measuring sensor, $V_{ref}$ forming the reference signal, which is also referred to as the unmodulated carrier signal and which has essentially the same frequency and phasing as the measuring signal, its amplitude corresponding to that of the measuring signal when the measuring sensor is in an idle or reference state, and $V_{out}$ forming the differential signal or output signal, which corresponds to the amplitude change of the measuring signal in the event of a sensor capacitance change. The differential signal $V_{out}$ assumes the value 0 if the measuring sensor is in the idle or reference state, because then the measuring signal $V_{meas}$ is equal to the reference signal $V_{ref}$. The change of the measuring signal caused by the sensor capacitance change is thus maintained in the differential signal $V_{out}$, while the carrier signal is no longer contained therein and/or is suppressed.

If complete suppression of the carrier signal is not desired, for example, if the control/analysis unit connected downstream from the receiving electronics works better if the differential signal $V_{out}$ contains a certain component of the carrier signal and/or its carrier amplitude, the signal subtraction is modified as follows:

$$V_{out} = V_{meas} - aV_{ref}$$

the attenuation factor a being selected as less than 1.

The calculation of the differential signal $V_{out}$ has the advantage that a control/analysis unit connected downstream from the system for measuring a physical value is supplied with a signal having a relatively small amplitude. This reduces the overload danger in the control/analysis unit and allows pre-amplification in the control/analysis unit and/or in the receiving electronics of the system which are connected downstream from the measuring sensors. Furthermore, the danger of crosstalk between the channels of the measuring sensors to the control/analysis unit and within the control/analysis unit is reduced.

The reference signal $V_{ref}$ may be generated using a reference signal generator in the form of a reference oscillator, for example. Preferably, however, a reference sensor is used as the reference signal generator, which is constructed identically to a measuring sensor. Only the measuring sensor is then subjected to the physical value to be measured. Environmental influences such as temperature and moisture act equally on both sensors, in contrast. Upon the subtraction of their output variables, the influence of the environmental influences may therefore be reduced and/or eliminated.

Figure 21:
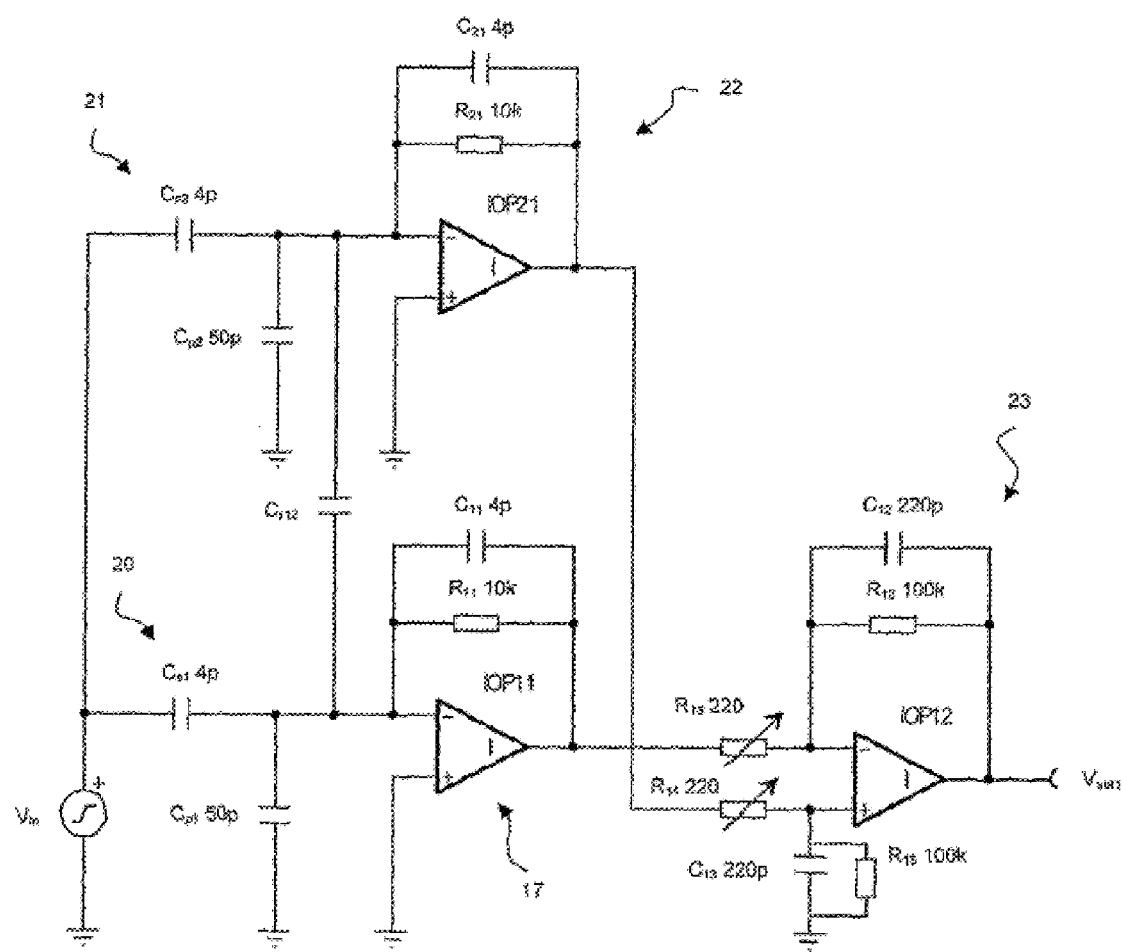
FIG. 21 shows a block diagram of a system of two measuring sensors having downstream inverting measuring signal amplifiers and downstream integrator.

FIG. 21 shows a block diagram of a system for measuring a physical value, which outputs the differential signal $V_{out1}$ as the output signal. A measuring sensor 20 having a sensor capacitance $C_{s1}$ and a parallel capacitance $C_{p1}$ and a reference sensor having a sensor capacitance $C_{s2}$ and a parallel capacitance $C_{p2}$ are provided. The reference sensor 21 represents the reference signal generator. For example, only one measuring sensor 20 is shown. However, multiple measuring sensors 20 having associated measuring signal amplifiers 17 and integrators 23 may be provided, either one reference sensor 21 being associated with each measuring sensor 20 or multiple measuring sensors 20 being associated with a single reference sensor 21.

A parasitic crosstalk capacitance $C_{X12}$ is taken into consideration between the output of the measuring sensor 20 and the output of the reference sensor 21. The output of the measuring sensor 20 is connected to an inverting input of an inverting measuring signal amplifier 17, whose counter coupling has a parallel circuit made of a capacitor $C_{11}$ and a resistor $R_{11}$. The output of the reference sensor 21 is connected to an inverting input of an inverting reference signal amplifier 21, whose counter coupling has a parallel circuit made of a capacitor $C_{21}$ and a resistor $R_{21}$. The inverting measuring signal amplifier 17 and/or the inverting reference signal amplifier 22 are preferably implemented as a high-pass filter.

An integrator 23 is connected downstream from the inverting measuring signal amplifier 17, whose inverting input is connected via a resistor $R_{13}$ to the output of the inverting measuring signal amplifier 17 and whose non-inverting input is connected via a resistor $R_{14}$ to the output of the inverting reference signal amplifier 22. The resistors $R_{13}$ and $R_{14}$ are preferably adjustable and/or may be trimmed. The non-inverting input of the integrator 13 is connected via a capacitor $C_{13}$ and a resistor $R_{15}$ to ground. The counter coupling of the integrator 23 is formed by a parallel circuit of a capacitor $C_{12}$ and a resistor $R_{12}$.

The output signal $V_{out1}$ of the integrator 23 thus forms the integrated difference of the output signal of the inverting measuring signal amplifier 17 and the output signal of the inverting reference signal amplifier 22, whereby a suppression of the carrier signal and/or reference signal in the output signal $V_{out1}$ may be achieved. By trimming the resistor $R_{13}$, a suppression of the carrier signal may be optimized. A further optimization of the suppression of the carrier signal may be achieved by trimming both the resistor $R_{13}$ and also the resistor $R_{14}$.

Figure 22:
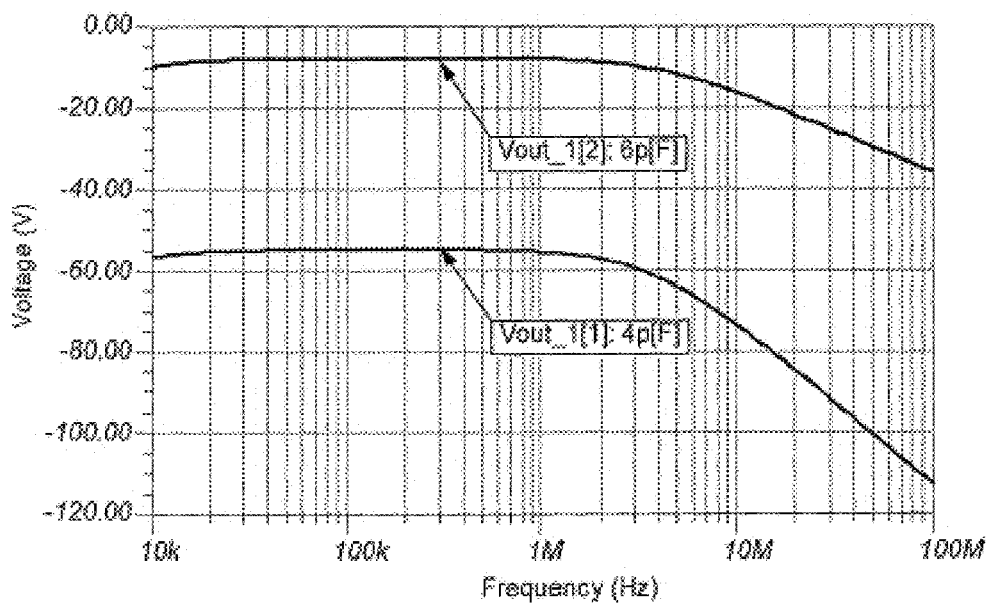
FIG. 22 shows a diagram having amplitude responses of the block diagram from FIG. 21.

FIG. 22 shows a diagram having amplitude responses of the circuit diagram shown in FIG. 21 for a sensor capacitance $C_{s1}$ of 4 pF or 6 pF. Furthermore, the values specified in FIG. 21 were assigned to the components shown in FIG. 21 for the calculation of the amplitude responses in FIG. 22 and the signal curves in FIG. 23. In the amplitude responses in FIG. 22, a clear dependence of the amplitude of the output signal $V_{out1}$ on the sensor capacitance is recognizable. The subtraction of a reference signal from the measuring signal thus has a positive effect on the sensitivity of the output signal $V_{out1}$ in relation to changes of the sensor capacitance $C_{s1}$.

Figure 23:
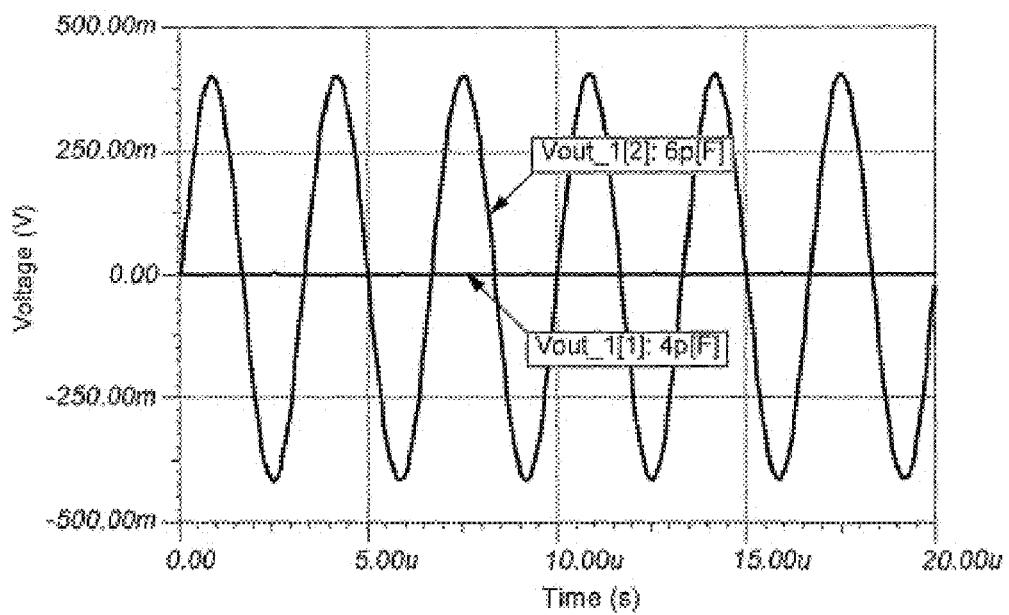
FIG. 23 shows a diagram having signal curves of the block diagram from FIG. 21.

The diagram in FIG. 23 shows the curve shapes of the output signal $V_{out1}$ over time for a sensor capacitance $C_{s1}$ of 4 pF or 6 pF. The sensor capacitance $C_{s1}$ of 4 pF represents the idle or reference state of the measuring sensor 20, in which the sensor capacitance $C_{s1}$ of the measuring sensor 20 corresponds to the sensor capacitance $C_{s2}$ of the reference sensor 21. Correspondingly, for a sensor capacitance $C_{s1}$ of 4 pF, the output signal of the measuring sensor 20 essentially corresponds to the output signal of the reference sensor 21 and the differential signal $V_{out1}$ is essentially 0. Upon increase of the sensor capacitance $C_{s1}$ of the measuring sensor 20 to 6 pF, the amplitude of the output or differential voltage $V_{out1}$ is strongly increased.

Some control/analysis units for analyzing the differential signal $V_{out1}$, which may be connected downstream from the system shown in FIG. 21, require a reference signal for the analysis, whose frequency and phasing correspond to the measuring signal. This is the case, for example, for so-called lock-in amplifiers and synchronous rectifiers. The reference signal may be derived from the output signal of the reference signal 21 for such a case using a system as shown as a circuit diagram in FIG. 24.

Figure 24:
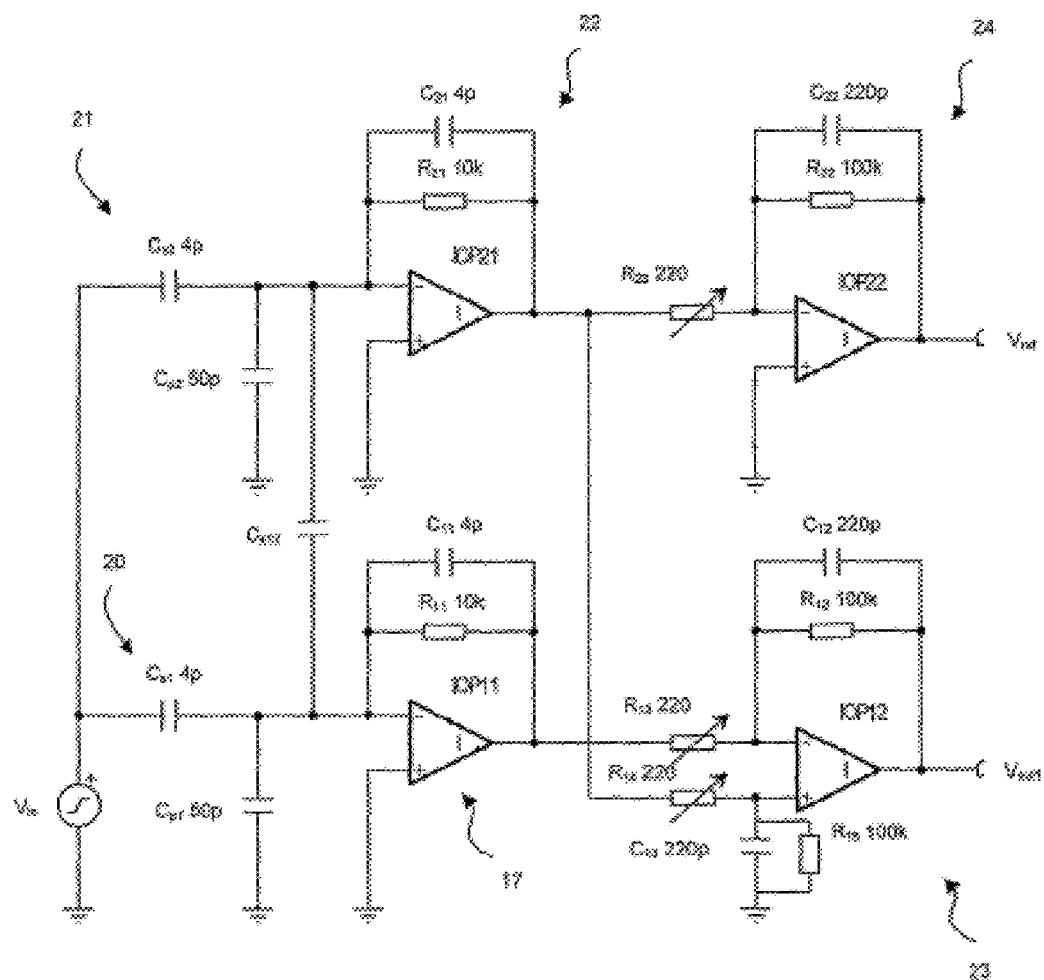
FIG. 24 shows a circuit diagram of a system of two measuring sensors having downstream measuring signal amplifiers, an integrator being connected downstream from each measuring signal amplifier.

The system shown in FIG. 24 corresponds to the system shown in FIG. 21, in addition to the inverting reference signal amplifier 22, an integrator 24 being connected downstream, whose inverting input is connected via a resistor $R_{23}$ to the output of the inverting reference signal amplifier 22. The non-inverting input of the integrator 24 is applied at ground. The counter coupling of the integrator 24 downstream from the inverting reference signal amplifier 22 is formed by a parallel circuit made of a capacitor $C_{22}$ and a resistor $R_{22}$, whose values preferably correspond to the values of the capacitor $C_{12}$ and the resistor $R_{12}$ of the integrator 23, which is connected downstream from the inverting measuring signal amplifier 17. The reference signal $V_{ref}$, which is in phase with the output and/or differential signal $V_{out1}$, which is applied at the output of the integrator 23, which is connected downstream from the inverting measuring signal amplifier 17, is applied at the output of the integrator 24 downstream from the inverting reference signal amplifier 22, because signal amplifiers 17, 22 and integrators 23, 24 are provided both in the reference signal path or in the path of the reference sensor 21 and also in the measuring signal path or in the path of the measuring sensor 20 of the circuit diagram of FIG. 24.

A suppression of the carrier signal may in turn be optimized via trimming of the resistors $R_{13}$, $R_{14}$. The resistor $R_{23}$ between the output of the inverting reference signal amplifier 22 and the inverting input of the integrator 24 is preferably trimmed in accordance with the resistors $R_{13}$, $R_{14}$, in order to ensure identical transmission behavior.

Figure 25:
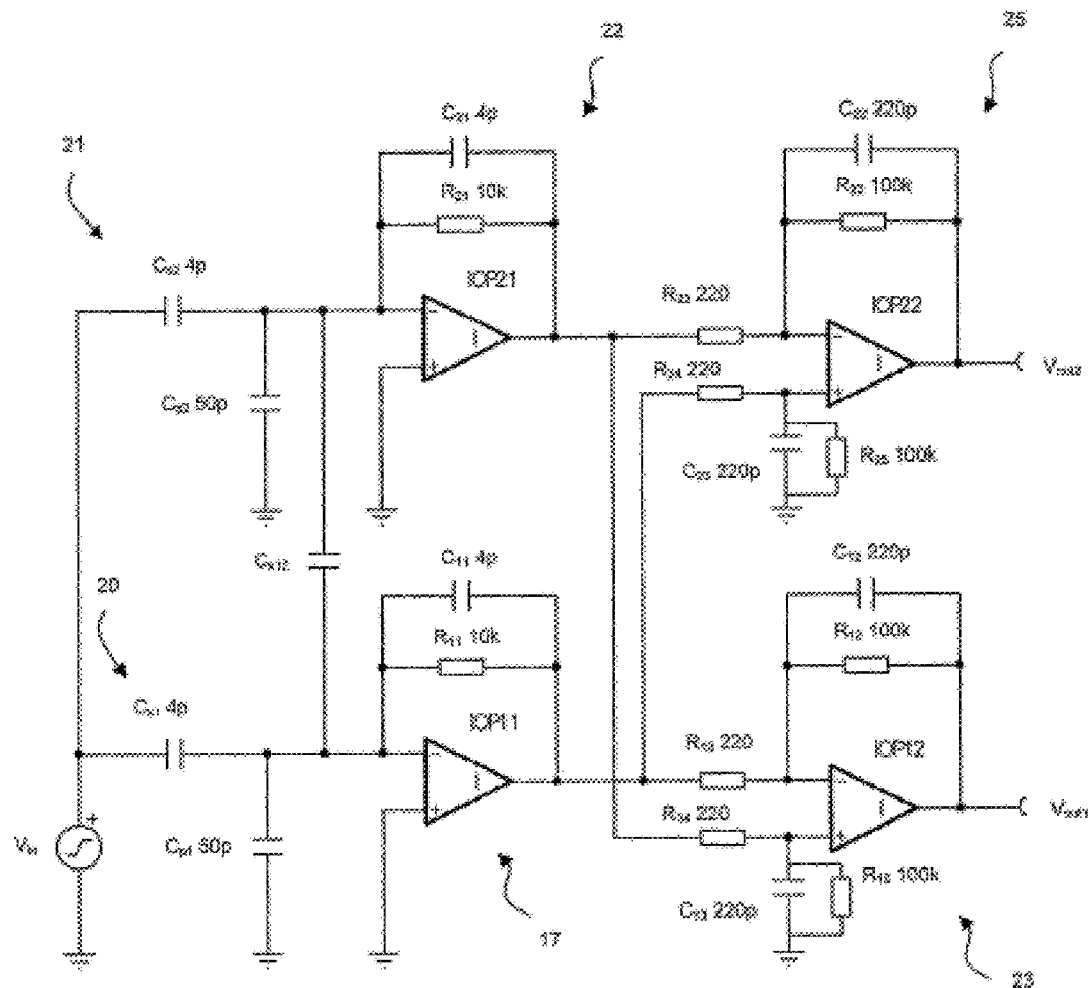
FIG. 25 shows a circuit diagram of a further system of two measuring sensors having downstream measuring signal amplifiers, an integrator being connected downstream from each measuring signal amplifier.

If a control/analysis unit, which is connected downstream from a system for measuring a physical value, is designed in such a way that it operates symmetrically, the measuring path and the reference path of the system according to FIG. 25 are preferably designed symmetrically, in that the signal of the other path is subtracted both in the measuring path and also in the reference path by the particular integrator 23, 25. The circuit diagram shown in FIG. 25 corresponds to the circuit diagram shown in FIG. 24, for the reference calculation in the reference path, the non-inverting input of the integrator 25 downstream from the inverting reference signal amplifier 22 being connected via a resistor $R_{24}$ to the output of the inverting measuring signal amplifier 17. The non-inverting input of the integrator 25 is also connected via a capacitor $C_{23}$ and a resistor $R_{25}$ to ground.

The resistor $R_{24}$ and the capacitor $C_{23}$ preferably correspond in value to the resistor $R_{14}$ and the capacitor $C_{13}$ of the integrator 23, which is downstream from the inverting measuring signal amplifier 17. The output signal $V_{out2}$ of the integrator 25 included in the reference path thus represents the integrated difference of the output signal of the inverting reference signal amplifier 22 and the output signal of the inverting measuring signal amplifier 17.

While preferred embodiments and/or embodiments of the invention are described in the present application, it is to be clearly noted that the invention is not restricted thereto and may also be implemented in other ways within the scope of the following claims.

The invention claimed is:

1. A system for measuring a physical value having multiple capacitive measuring sensors (20) and an inverting measuring signal amplifier (17; 17.1, 17.2) being connected downstream from each measuring sensor (20), one output of a measuring sensor (20) being connected to an inverting input of the inverting measuring signal amplifier (17; 17.1, 17.2) connected downstream from the measuring sensor (20) in each case, characterized in that a reference sensor (21) is associated with each measuring sensor (20), whereby an inverting reference signal amplifier (22) is connected downstream of said reference sensor 21, one output of the reference sensor (21) being connected to an inverting input of the inverting reference signal amplifier (22), a signal generator (26) is associated with each measuring sensor (20) and reference sensor (21), and means for subtracting the output signal of the inverting reference signal amplifier (22) from the output signal of the inverting measuring signal amplifier (17; 17.1, 17.2) in order to output a differential signal ($V_{out}1$) as output signal.

2. The system according to claim 1, characterized in that the receiver electrodes (E; E1, E2, E3, E4) are situated in a spatial plane and no shielding is provided in the spatial plane between the receiver electrodes (E; E1, E2, E3, E4).

3. The system according to claim 1, characterized in that an integrator (19; 23) is connected downstream from each inverting measuring signal amplifier (17; 17.1, 17.2), to whose inverting input an output signal of the inverting measuring signal amplifier (17; 17.1, 17.2) is applied, wherein the differential signal ($V_{out}1$) of the integrator (23) forms the integrated difference of the output signal of the inverting measuring signal amplifier (17; 17.1, 17.2) and the output signal of the inverting reference signal amplifier (22).

4. The system according to claim 1, characterized in that an integrator (25) is connected downstream from the inverting reference signal amplifier (22), to whose inverting input an output signal of the inverting reference signal amplifier (22) is applied.

5. The system according to claim 4, characterized in that an output signal of the inverting measuring signal amplifier (17; 17.1, 17.2), to which the measuring sensor (20) is connected downstream, with which the reference sensor (21) is associated, to which the inverting reference signal amplifier (22) is connected downstream, is applied to the non-inverting input of the integrator (25) downstream from the inverting reference signal amplifier (22).

6. The system according to claim 1, characterized in that the inverting measuring signal amplifier (17; 17.1, 17.2) and/or the inverting reference signal amplifier (22) are each implemented as a high-pass filter.

7. The system according to claim 1, characterized in that the multiple measuring sensors (20) are formed by a transmitter electrode (S) and multiple receiver electrodes (E; E1, E2, E3, E4), the receiver electrodes (E; E1, E2, E3, E4) being situated spaced apart from the transmitter electrode (S).

* * * * *